United States Patent
Devnath et al.

(10) Patent No.: US 6,970,048 B1
(45) Date of Patent: Nov. 29, 2005

(54) INDUCTIVE-CAPACITIVE (LC) BASED QUADRATURE VOLTAGE CONTROLLED OSCILLATOR (VCO) WITH DETERMINISTIC QUADRATURE SIGNAL PHASE RELATIONSHIP

(75) Inventors: Varadarajan Devnath, Santa Clara, CA (US); Jitendra Mohan, Santa Clara, CA (US); Quyet Nguyen, San Jose, CA (US); Yongseon Koh, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 139 days.

(21) Appl. No.: 10/734,357

(22) Filed: Dec. 12, 2003

(51) Int. Cl.[7] .............................. H03B 5/08; H03B 5/12
(52) U.S. Cl. .......................... 331/46; 331/48; 331/55; 331/108 B; 331/117 R; 331/117 FE; 331/172; 331/177 V
(58) Field of Search ............................... 331/46, 48, 50, 331/52, 55, 108 B, 117 R, 117 FE, 117 D, 331/135–137, 172, 177 R, 177 V

(56) References Cited

U.S. PATENT DOCUMENTS 4,763,085 A * 8/1988 Lamberg ..................... 331/56

OTHER PUBLICATIONS

Peter Vancorenland and Michiel S.J. Steyaert, A 1.57-GHz Fully Integrated Very Low-Phase-Noise Quadrature VCO, IEEE Journal of Solid-State Circuits, vol. 37, No. 5, May 2002.
Pepijn Van De Ven, Johan Van Der Tang, Dieter Kasperkovitz, Arthur Van Roermund, An Optimally Coupled 5 GHz Quadrature LC Oscillator, 2001 Symposium on VLSI Circuits Digest of Technical Papers.
Pietro Andreani, Andrea Bonfanti, Luca Romano and Carlo Samori, Analysis and Design of a 1.8-GHz CMOS LC Quadrature VCO, IEEE Journal of Solid-State Circuits, vol. 37, No. 12, Dec. 2002.

* cited by examiner

Primary Examiner—David Mis
(74) Attorney, Agent, or Firm—Vedder Price Kaufman & Kammholz, P.C.

(57) ABSTRACT

A circuit and method for generating quadrature signals with a deterministic phase relationship. Between two inductive-capacitive (LC) based quadrature voltage controlled oscillators (VCO), phase shift circuitry is interposed such that the individual LC VCO circuits produce signals with corresponding phase delays which ensure that the desired lead or lag phase relationship between the quadrature signals is achieved.

22 Claims, 2 Drawing Sheets

0# INDUCTIVE-CAPACITIVE (LC) BASED QUADRATURE VOLTAGE CONTROLLED OSCILLATOR (VCO) WITH DETERMINISTIC QUADRATURE SIGNAL PHASE RELATIONSHIP

BACKGROUND OF THE INVENTION

1. Field of the Invention

The present invention relates to voltage controlled oscillators and in particular, to inductive-capacitive (LC) based quadrature voltage controlled oscillators (VCOs).

2. Description of the Related Art

Radio frequency (RF) transceivers which rely on image rejection require accurate quadrature signals. One well known technique for generating quadrature signals involves the use of two symmetrical LC-tank VCOs (LC VCOs) so as to obtain the benefit of good phase noise performance of LC oscillators. Such a VCO implementation is often referred to as a quadrature VCO (QVCO).

Referring to FIG. 1, such a QVCO 10 is generally implemented as a two stage design with each stage A1, A2 providing 90 degrees of phase shift. The two stages A1, A2 are substantially identical and are connected in such a way that they effectively prevent each other from oscillating when their relative phase is not in quadrature. As a result, these coupled oscillators A1, A2 synchronize to the same frequency regardless of mismatches in the resonant circuitry inside (discussed in more detail below).

As indicated, the noninverting and inverting output terminals of the differential output of the first stage A1 are connected directly to the differential input terminals of the second stage A2, i.e., to the corresponding noninverting and inverting input terminals. Conversely, the noninverting and inverting output terminals of the differential output of the second stage A2 are cross coupled to the differential input terminals of the first stage A1, i.e., the noninverting and inverting output terminals of the second stage A2 are connected to the inverting and noninverting input terminals of the first stage, respectively.

As a result of these direct and cross coupled connections, a differential, i.e., out of phase by 180 degrees, phase relationship is maintained between the noninverting and inverting terminals at the inputs and outputs of both stages A1, A2, and a 90 degree phase shift, i.e., a quarter wavelength of the oscillation frequency, is maintained between the corresponding input and output terminals. Hence, the differential output signals Vi (Vi+, Vi−), Vq (Vq+, Vq−) are in quadrature, i.e., are 90 degrees, or a quarter wavelength, apart with the I-phase signal Vi either leading or lagging the Q-phase signal Vq.

Referring to FIG. 1A, one example embodiment 20 of a VCO circuit for the stages A1, A2 of the circuit 10 of FIG. 1 includes a differential amplifier circuit and a resonant circuit in the form of a dual LC tank circuit. For example, N-type metal oxide semiconductor field effect transistors (N-MOSFETs) N1a and N1b are connected in a differential manner, and are biased with a tail current provided by N-MOSFET N2 which, in turn, is biased by a bias voltage Vbias. Additional transistors N3a, N3b are connected across the differential transistors N1a, N1b and are cross coupled via their respective drain and gate terminals, as shown. Symmetrical LC tank circuits are connected such that the power supply voltage VDD is applied to the differential amplifier transistors N1a, N1b, N3a, N3b through the inductors L1, L2. The tank capacitors C1, C2 are serially connected in a shunt arrangement across the output terminals OUT+, OUT−.

The inductors L1, L2 resonate with the capacitors C1, C2, as well as with junction capacitances between the gate and drain terminals of transistors N3a and N3b. This determines the frequency of oscillation. (It will be understood that the capacitors C1, C2 can be implemented as varactors so as to allow control over the frequency of oscillation.) The negative resistances of transistors N3a and N3b counteract losses within the inductors L1, L2. (Alternative forms of LC based VCO circuits, many of which are well known in the art, can be used as well, since the specific structure of such circuit is not material to the presently claimed invention.)

A problem with this conventional QVCO circuit 10, however, is that the two stages A1, A2 can provide either a positive or negative 90 degree phase shift, thereby potentially producing two different frequencies of operation as well as an indeterminate, i.e., probabilistic, phase relationship between the I-phase and Q-phase signals. Circuit applications requiring a known, or determinate, phase relationship in the quadrature output signals cannot tolerate this.

This chance for either a positive or negative quarter wavelength phase shift can be explained as follows. The total phase shift through the loop will be zero degrees, or a multiple of 360 degrees. If x is the phase shift provided by one VCO stage A1/A2, then this phase shift can be described as follows:

$$x+x+180=0 \text{ or } 360 \qquad (1)$$

$$x+x+180=360 => x=+90 \qquad (2)$$

$$x+x+180=0 => x=-90 \qquad (3)$$

Accordingly, the I-phase signal can lead or lag the Q-phase signal by 90 degrees. This indeterminate phase relationship between the I-phase and Q-phase signals presents a problem for a number of applications, including half-rate clock and data recovery systems which require quadrature clock signals. Such systems require the I-phase signal to lead the Q-phase signal to ensure correct data recovery. Similarly, RF receivers will produce either the lower sideband or upper sideband of an up-converted or down-converted signal depending upon the phase relationship of the I-phase and Q-phase signal. An incorrect phase relationship will produce the wrong sideband.

SUMMARY OF THE INVENTION

In accordance with the presently claimed invention, a circuit and method are provided for generating quadrature signals with a deterministic phase relationship. Between two inductive-capacitive (LC) based quadrature voltage controlled oscillators (VCO), phase shift circuitry is interposed such that the individual LC VCO circuits produce signals with corresponding phase delays which ensure that the desired lead or lag phase relationship between the quadrature signals is achieved.

In accordance with one embodiment of the presently claimed invention, an inductive-capacitive (LC) based quadrature voltage controlled oscillator (VCO) with a deterministic quadrature signal phase relationship includes LC VCO circuitries and phase shift circuitries. First LC VCO circuitry includes first differential VCO input terminals to receive a differential feedback signal having a signal wavelength and first differential VCO output terminals to convey a first differential VCO signal. First phase shift circuitry includes first differential phase shift input terminals directly coupled to the first differential VCO output terminals to receive the first differential VCO signal and first differential phase shift output terminals to convey a differential intermediate signal having the signal wavelength, wherein the first differential VCO signal and the differential intermediate signal differ in phase by a first phase difference less than a quarter of the signal wavelength with a predetermined polarity. Second LC VCO circuitry includes second differential VCO input terminals directly coupled to the first differential phase shift output terminals to receive the differential intermediate signal and second differential VCO output terminals to convey a second differential VCO signal. Second phase shift circuitry includes second differential phase shift input terminals directly coupled to the second differential VCO output terminals to receive the second differential VCO signal and second differential phase shift output terminals cross coupled to the first differential VCO input terminals to convey the differential feedback signal, wherein the second differential VCO signal and the differential feedback signal differ in phase by a second phase difference less than the quarter of the signal wavelength with the predetermined polarity, and the differential intermediate signal and the differential feedback signal have mutually quadrature signal phases with a quadrature phase difference having the predetermined polarity.

In accordance with another embodiment of the presently claimed invention, an inductive-capacitive (LC) based quadrature voltage controlled oscillator (VCO) with a deterministic quadrature signal phase relationship includes LC VCO means and phase shifter means. First LC VCO means is for receiving a differential feedback signal having a signal wavelength and in response thereto generating a first differential VCO signal. First phase shifter means is for directly receiving the first differential VCO signal and in response thereto generating a differential intermediate signal having the signal wavelength, wherein the first differential VCO signal and the differential intermediate signal differ in phase by a first phase difference less than a quarter of the signal wavelength with a predetermined polarity. Second LC VCO means is for directly receiving the differential intermediate signal and in response thereto generating a second differential VCO signal. Second phase shifter means is for directly receiving the second differential VCO signal and in response thereto generating the differential feedback signal in a cross coupled manner, wherein the second differential VCO signal and the differential feedback signal differ in phase by a second phase difference less than the quarter of the signal wavelength with the predetermined polarity, and the differential intermediate signal and the differential feedback signal have mutually quadrature signal phases with a quadrature phase difference having the predetermined polarity.

In accordance with still another embodiment of the presently claimed invention, a method for generating quadrature signals with a deterministic quadrature signal phase relationship includes:

receiving a differential feedback signal having a signal wavelength and in response thereto generating a first differential VCO signal;

directly receiving the first differential VCO signal and in response thereto generating a differential intermediate signal having the signal wavelength, wherein the first differential VCO signal and the differential intermediate signal differ in phase by a first phase difference less than a quarter of the signal wavelength with a predetermined polarity;

directly receiving the differential intermediate signal and in response thereto generating a second differential VCO signal; and directly receiving the second differential VCO signal and in response thereto generating the differential feedback signal in a cross coupled manner, wherein the second differential VCO signal and the differential feedback signal differ in phase by a second phase difference less than the quarter of the signal wavelength with the predetermined polarity, and the differential intermediate signal and the differential feedback signal have mutually quadrature signal phases with a quadrature phase difference having the predetermined polarity.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
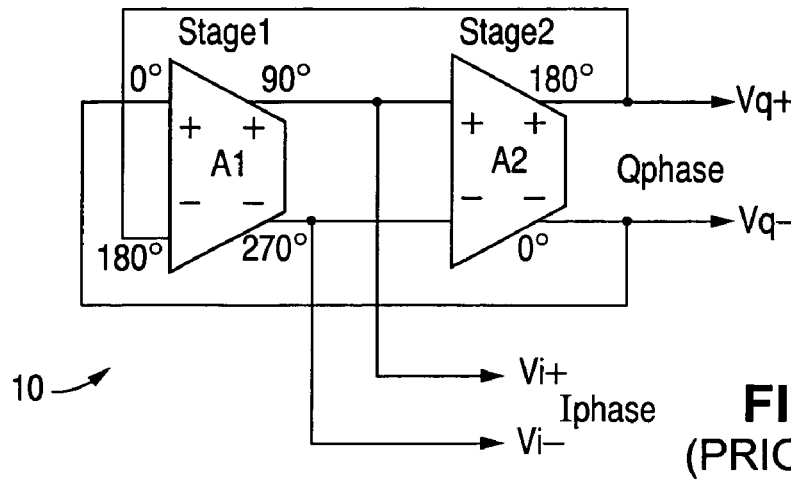
FIG. 1 is a functional block diagram of a conventional quadrature VCO circuit.
Figure 1A:
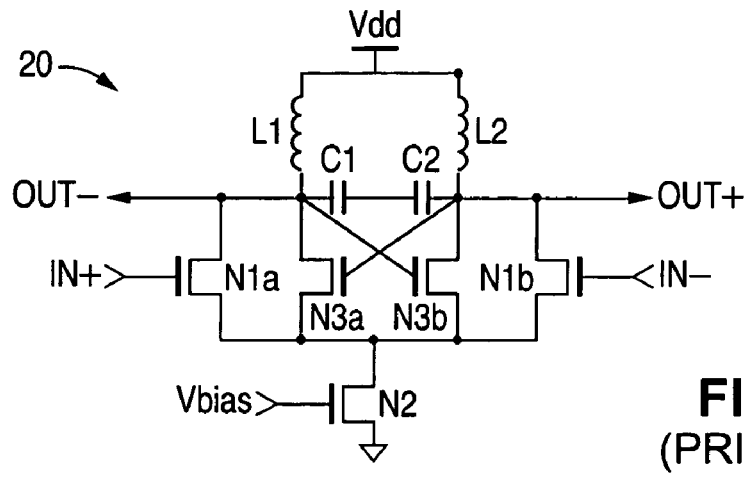
FIG. 1A is a circuit schematic diagram of an example embodiment of a conventional VCO stage for the circuit of FIG. 1.
Figure 2:
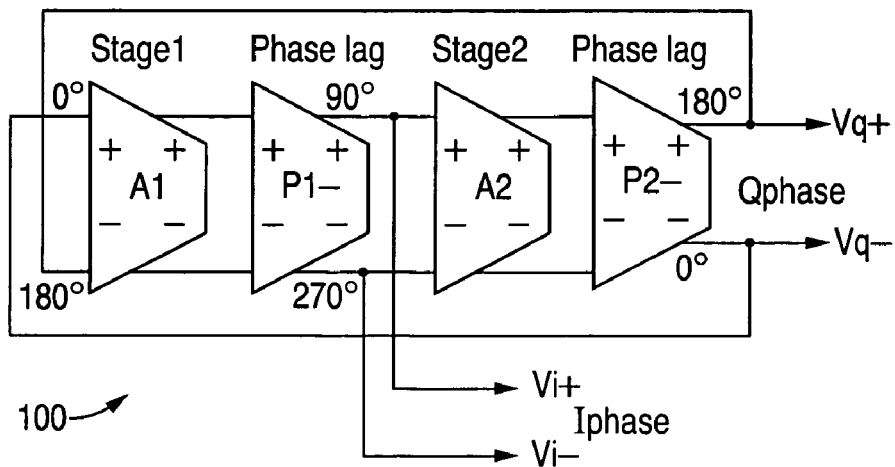
FIG. 2 is a functional block diagram of a quadrature VCO circuit in accordance with one embodiment of the presently claimed invention.

Referring to FIG. 2, a quadrature VCO in accordance with one embodiment 100 of the presently claimed invention includes, in addition to the two VCO stages A1, A2, two phase shift circuits in the form of phase lag circuits P1−, P2−. The differential outputs of the first VCO stage A1 are directly coupled to the differential inputs of the first phase lag circuit P1−, the differential outputs of the first phase lag circuit P1− are directly coupled to the differential inputs of the second VCO stage A2, and the differential outputs of the second VCO stage A2 are directly coupled to the differential inputs of the second phase lag circuit P2−. The differential outputs of the second phase lag P2− are cross coupled to the differential inputs of the first VCO stage A1.

This circuit architecture takes advantage of the fact that each stage of the oscillator cannot produce more than 90 degrees of phase shift. This circuit 100 includes two "stages", with the first "stage" being the combination of the first VCO stage A1 and first phase lag circuit P1−, and the second "stage" being the combination of the second VCO stage A2 and second phase lag circuit P2−.

In this circuit 100, the I-phase signal will always lead the Q-phase signal due to the introduction of negative phase shifts, i.e., phase lags, by the phase lag circuits P1−, P2−. As discussed above, the total phase lag through the loop will be zero degrees or multiples of 360 degrees. If x is the phase lag provided by one VCO stage A1/A2, and y is the phase lag introduced by one phase lag circuit P1−, P2−, the phase relationships can be expressed as follows:

$$x+y+x+y+180=360 => x=90-y \tag{4}$$

$$x+y+x+y+180=0 => x=-90-y \tag{5}$$

As discussed above, since the phase lag introduced by each "stage" must be between −90 degrees and +90 degrees, then the phase relationship must be that as expressed above in Equation 4, i.e., x=90−y. For example, if a 10 degree phase lag is introduced by each phase lag circuit P1−, P2−, then y=10 and the phase relationships can be expressed as follows:

$$x+10+x+10+180=360 => x=+80 \tag{6}$$

$$x+10+x+10+180=0 => x=-100 \tag{7}$$

Since the phase lag introduced by each LC VCO must be between −90 degrees and +90 degrees, then the phase shift introduced by each VCO stage A1, A2 must be a phase lag of 80 degrees, i.e., x=80. Hence, the total phase lag between the I-phase and Q-phase signals is the sum of the phase lag introduced by the VCO stage A1/A2 (80 degrees) and the phase lag introduced by the phase lag circuit P1−/P2− (10 degrees), which is 90 degrees, or a quarter wavelength of the oscillation frequency. Accordingly, since the phase lag between the I-phase and Q-phase signals can only be +90 degrees and not −90 degrees, then the I-phase signal will always lead the Q-phase signal.

Figure 2A:
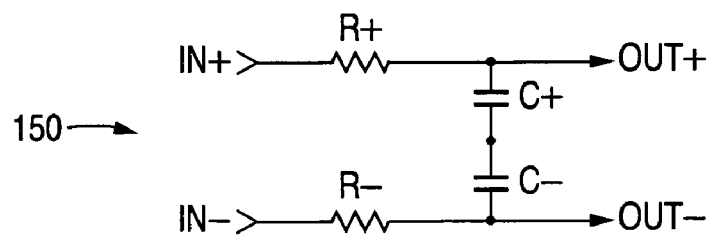
FIG. 2A is a circuit schematic diagram of one example embodiment of the phase shift circuitry for the circuit of FIG. 2.

Referring to FIG. 2A, the phase lag circuits P1−, P2− can be implemented using a circuit 150 as shown. Serially connected resistors R+, R− directly couple the differential input and output terminals, while serially connected capacitors C+, C− are connected in shunt across the differential output terminals. (Alternative forms of phase lag circuits, many of which are well known in the art, can be used as well, since the specific structure of such circuit is not material to the presently claimed invention.)

Figure 3:
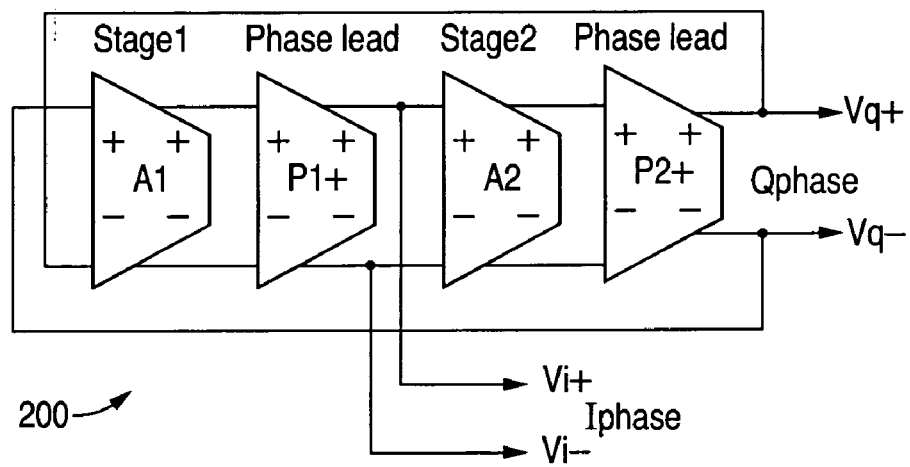
FIG. 3 is a functional block diagram of a quadrature VCO circuit in accordance with another embodiment of the presently claimed invention.

Referring to FIG. 3, a quadrature VCO in accordance with another embodiment 200 of the presently claimed invention has a similar architecture, but uses phase lead circuits P1+, P2+ as the phase shift circuits so as to cause the Q-phase signal to always lead the I-phase signal. Hence, instead of a negative phase shift, the phase shift circuits P1+, P2+ introduce positive phase shifts (phase leads) at the output of each VCO stage A1, A2.

As before, the total phase lag through the loop must be zero degrees or multiples of 360 degrees. If x is the phase lag provided by one VCO stage A1/A2, and y is the phase lag introduced by one phase lead circuit P1+/P2+, then the phase relationships can be expressed by Equations 4 and 5 above. Since the phase lag introduced by each "stage" must be between −90 degrees and +90 degrees, then Equation 5 must describe the proper phase relationship, i.e., x=−90−y, where y is a negative quantity. For example, if a 10 degree phase lead, i.e., a −10 degree phase lag, is introduced by each phase lead circuit P1+, P2+, the phase relationships can be expressed as follows:

$$x-10+x-10+180=360 => x=+100 \tag{8}$$

$$x-10+x-10+180=0 => x=-80 \tag{9}$$

Since the phase lag introduced by each stage must be between −90 degrees and +90 degrees, then the phase lag, or negative phase lead, introduced by each VCO stage A1, A2 must be −80 degrees, i.e., x=−80. As a result, the total phase lag between the I-phase and Q-phase signals is the sum of the phase lag introduced by the VCO stage A1/A2 (−80 degrees) and the phase lag introduced by the phase lead circuit P1+/P2+ (−10 degrees), which is −90 degrees. Hence, since the phase lag between the I-phase and Q-phase signals can only be −90 degrees and not +90 degrees, the I-phase signal will always lag the Q-phase signal.

Figure 3A:
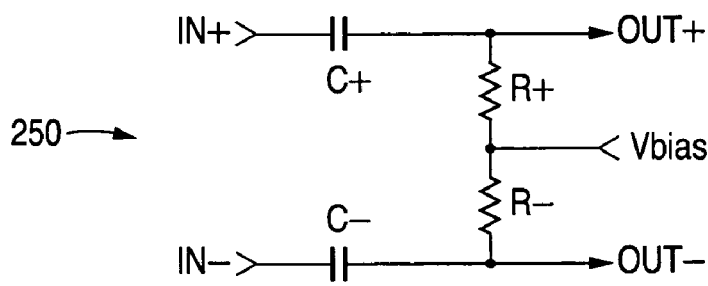
FIG. 3A is a circuit schematic diagram of one example embodiment of the phase shift circuitry for the circuit of FIG. 3.

Referring to FIG. 3A, the phase lead circuits P1+, P2+ can be implemented using a circuit 250 such as that shown. Serially connected capacitors C+, C− directly couple the differential input and output terminals, while serially connected resistors R+, R− are connected in shunt across the output terminals. The bias voltage Vbias is applied between the resistors R+, R− to maintain the differential signal balance. (Alternative forms of phase lead circuits, many of which are well known in the art, can be used as well, since the specific structure of such circuit is not material to the presently claimed invention.)

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an inductive-capacitive (LC) based quadrature voltage controlled oscillator (VCO) with a deterministic quadrature signal phase relationship, comprising:

first LC VCO circuitry including first differential VCO input terminals to receive a differential feedback signal having a signal wavelength and first differential VCO output terminals to convey a first differential VCO signal;

first phase shift circuitry including first differential phase shift input terminals directly coupled to said first differential VCO output terminals to receive said first differential VCO signal and first differential phase shift output terminals to convey a differential intermediate signal having said signal wavelength, wherein said first differential VCO signal and said differential intermediate signal differ in phase by a first phase difference less than a quarter of said signal wavelength with a predetermined polarity;

second LC VCO circuitry including second differential VCO input terminals directly coupled to said first differential phase shift output terminals to receive said differential intermediate signal and second differential VCO output terminals to convey a second differential VCO signal; and second phase shift circuitry including second differential phase shift input terminals directly coupled to said second differential VCO output terminals to receive said second differential VCO signal and second differential phase shift output terminals cross coupled to said first differential VCO input terminals to convey said differential feedback signal, wherein said second differential VCO signal and said differential feedback signal differ in phase by a second phase difference less than said quarter of said signal wavelength with said predetermined polarity, and said differential intermediate signal and said differential feedback signal have mutually quadrature signal phases with a quadrature phase difference having said predetermined polarity.

2. The apparatus of claim 1, wherein said first and second phase differences are substantially equal.

3. The apparatus of claim 1, wherein:
responsive to reception of said differential feedback signal by said first LC VCO circuitry, said differential feedback signal and said first differential VCO signal differ in phase by a third phase difference less than said quarter of said signal wavelength with said predetermined polarity; and
responsive to reception of said differential intermediate signal by said second LC VCO circuitry, said differential intermediate signal and said second differential VCO signal differ in phase by a fourth phase difference less than said quarter of said signal wavelength with said predetermined polarity.

4. The apparatus of claim 1, wherein said differential intermediate signal leads said differential feedback signal in phase.

5. The apparatus of claim 1, wherein said differential intermediate signal lags said differential feedback signal in phase.

6. The apparatus of claim 1, wherein:
said first LC VCO circuitry comprises
first differential amplifier circuitry coupled between said first differential VCO input terminals and said first differential VCO output terminals, and
first resonator circuitry coupled to said first differential amplifier circuitry; and
said second LC VCO circuitry comprises
second differential amplifier circuitry coupled between said second differential VCO input terminals and said second differential VCO output terminals, and
second resonator circuitry coupled to said second differential amplifier circuitry.

7. The apparatus of claim 1, wherein said first and second phase shift circuitries comprise first and second phase lag circuitries, respectively.

8. The apparatus of claim 7, wherein said differential intermediate signal leads said differential feedback signal in phase.

9. The apparatus of claim 7, wherein:
said first phase lag circuitry comprises
first and second series resistances coupled directly between respective ones of said first differential phase shift input terminals and said first differential phase shift output terminals, and
a first shunt capacitance coupled between said first differential phase shift output terminals; and
said second phase lag circuitry comprises
third and fourth series resistances coupled directly between respective ones of said second differential phase shift input terminals and said second differential phase shift output terminals, and
a second shunt capacitance coupled between said second differential phase shift output terminals.

10. The apparatus of claim 1, wherein said first and second phase shift circuitries comprise first and second phase lead circuitries, respectively.

11. The apparatus of claim 10, wherein said differential intermediate signal lags said differential feedback signal in phase.

12. The apparatus of claim 10, wherein:
said first phase lead circuitry comprises
first and second series capacitances coupled directly between respective ones of said first differential phase shift input terminals and said first differential phase shift output terminals, and
a first shunt resistance coupled between said first differential phase shift output terminals; and
said second phase lead circuitry comprises
third and fourth series capacitances coupled directly between respective ones of said second differential phase shift input terminals and said second differential phase shift output terminals, and
a second shunt resistance coupled between said second differential phase shift output terminals.

13. An apparatus including an inductive-capacitive (LC) based quadrature voltage controlled oscillator (VCO) with a deterministic quadrature signal phase relationship, comprising:
first LC VCO means for receiving a differential feedback signal having a signal wavelength and in response thereto generating a first differential VCO signal;
first phase shifter means for directly receiving said first differential VCO signal and in response thereto generating a differential intermediate signal having said signal wavelength, wherein said first differential VCO signal and said differential intermediate signal differ in phase by a first phase difference less than a quarter of said signal wavelength with a predetermined polarity;
second LC VCO means for directly receiving said differential intermediate signal and in response thereto generating a second differential VCO signal; and
second phase shifter means for directly receiving said second differential VCO signal and in response thereto generating said differential feedback signal in a cross coupled manner, wherein said second differential VCO signal and said differential feedback signal differ in phase by a second phase difference less than said quarter of said signal wavelength with said predetermined polarity, and said differential intermediate signal and said differential feedback signal have mutually quadrature signal phases with a quadrature phase difference having said predetermined polarity.

14. A method for generating quadrature signals with a deterministic quadrature signal phase relationship, comprising:
receiving a differential feedback signal having a signal wavelength and in response thereto generating a first differential VCO signal;
directly receiving said first differential VCO signal and in response thereto generating a differential intermediate signal having said signal wavelength, wherein said first differential VCO signal and said differential intermediate signal differ in phase by a first phase difference less than a quarter of said signal wavelength with a predetermined polarity;

directly receiving said differential intermediate signal and in response thereto generating a second differential VCO signal; and directly receiving said second differential VCO signal and in response thereto generating said differential feedback signal in a cross coupled manner, wherein said second differential VCO signal and said differential feedback signal differ in phase by a second phase difference less than said quarter of said signal wavelength with said predetermined polarity, and said differential intermediate signal and said differential feedback signal have mutually quadrature signal phases with a quadrature phase difference having said predetermined polarity.

15. The method of claim 14, wherein said first and second phase differences are substantially equal.

16. The method of claim 14, wherein:

said receiving a differential feedback signal having a signal wavelength and in response thereto generating a first differential VCO signal comprises generating said first differential VCO signal such that said differential feedback signal and said first differential VCO signal differ in phase by a third phase difference less than said quarter of said signal wavelength with said predetermined polarity; and said directly receiving said differential intermediate signal and in response thereto generating a second differential VCO signal comprises generating said second differential VCO signal such that said differential intermediate signal and said second differential VCO signal differ in phase by a fourth phase difference less than said quarter of said signal wavelength with said predetermined polarity.

17. The method of claim 14, wherein said differential intermediate signal leads said differential feedback signal in phase.

18. The method of claim 14, wherein said differential intermediate signal lags said differential feedback signal in phase.

19. The method of claim 14, wherein:

said directly receiving said first differential VCO signal and in response thereto generating a differential intermediate signal having said signal wavelength comprises generating said differential intermediate signal such that said differential intermediate signal lags said first differential VCO signal in phase; and said directly receiving said second differential VCO signal and in response thereto generating said differential feedback signal in a cross coupled manner comprises generating said differential feedback signal such that said differential feedback signal lags said second differential VCO signal in phase.

20. The method of claim 19, wherein said differential intermediate signal leads said differential feedback signal in phase.

21. The method of claim 14, wherein said said directly receiving said first differential VCO signal and in response thereto generating a differential intermediate signal having said signal wavelength comprises generating said differential intermediate signal such that said differential intermediate signal leads said first differential VCO signal in phase; and said directly receiving said second differential VCO signal and in response thereto generating said differential feedback signal in a cross coupled manner comprises generating said differential feedback signal such that said differential feedback signal leads said second differential VCO signal in phase.

22. The method of claim 21, wherein said differential intermediate signal lags said differential feedback signal in phase.

* * * * *